(12) United States Patent
Then et al.

(10) Patent No.: US 8,005,124 B2
(45) Date of Patent: Aug. 23, 2011

(54) OPTICAL BANDWIDTH ENHANCEMENT OF LIGHT EMITTING AND LASING TRANSISTOR DEVICES AND CIRCUITS

(75) Inventors: Han Wui Then, Urbana, IL (US); Gabriel Walter, Champaign, IL (US); Milton Feng, Champaign, IL (US); Nick Holonyak, Jr., Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 17 days.

(21) Appl. No.: 12/587,895

(22) Filed: Oct. 14, 2009

(65) Prior Publication Data

US 2010/0103971 A1  Apr. 29, 2010

Related U.S. Application Data

(60) Provisional application No. 61/196,172, filed on Oct. 15, 2008.

(51) Int. Cl.
*H01S 5/00* (2006.01)
(52) U.S. Cl. ............ 372/46.011; 372/43.01; 372/44.01; 372/45.01; 372/30
(58) Field of Classification Search ............... 372/43.01, 372/44.01, 45.01, 46.011, 30
See application file for complete search history.

(56) References Cited

U.S. PATENT DOCUMENTS

| | | | |
|---|---|---|---|
| 7,091,082 B2 | 8/2006 | Feng et al. | 438/235 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,711,015 B2 | 5/2010 | Holonyak et al. | 372/11 |
| 2005/0040432 A1 | 2/2005 | Feng et al. | 257/198 |
| 2005/0054172 A1 | 3/2005 | Feng et al. | 438/313 |
| 2006/0208290 A1* | 9/2006 | Feng et al. | 257/292 |
| 2007/0223547 A1* | 9/2007 | Feng et al. | 372/44.01 |
| 2010/0034228 A1 | 2/2010 | Holonyak et al. | 374/45 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).
Quantum-Well-Base Heterojunction Bipolar Light-Emitting Transistor, M. Feng, N. Holonyak, Jr., and R. Chan, Appl. Phys. Lett. 84, 1952 (2004).
Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).
Laser Operation of a Heterojunction Bipolar Light-Emitting Transistor, G. Walter, N. Holonyak, Jr., M. Feng, and R. Chan, Appl. Phys. Lett. 85, 4768 (2004).
Microwave Operation and Modulation of a Transistor Laser, R. Chan, M. Feng, N. Holonyak, Jr., and G. Walter, Appl. Phys. Lett. 86, 131114 (2005).

(Continued)

*Primary Examiner* — Kinam Park
(74) *Attorney, Agent, or Firm* — Martin Novack

(57) ABSTRACT

A method for producing wide bandwidth laser emission responsive to high frequency electrical input signals, including the following steps: providing a heterojunction bipolar transistor device having collector, base, and emitter regions; providing at least one quantum size region in the base region, and enclosing at least a portion of the base region in an optical resonant cavity; coupling electrical signals, including the high frequency electrical input signals, with respect to the collector, base and emitter region, to cause laser emission from the transistor device; and reducing the operating beta of the transistor laser device to enhance the optical bandwidth of the laser emission in response to the high frequency electrical signals.

14 Claims, 4 Drawing Sheets

OTHER PUBLICATIONS

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan, N. Holonyak, Jr., A. James, G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed ($\geq 1$ GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta > 49$) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 µm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr. Appl. Phys. Lett. 93, 163504 (2008).

\* cited by examiner

OPTICAL BANDWIDTH ENHANCEMENT OF LIGHT EMITTING AND LASING TRANSISTOR DEVICES AND CIRCUITS

PRIORITY CLAIM

Priority is claimed from U.S. Provisional Patent Application No. 61/196,172, filed Oct. 15, 2008. and said U.S. Provisional Patent Application is incorporated herein by reference.

GOVERNMENT SUPPORT

This invention was made with Government support under DARPA Contract No. HR0011-04-1-0034, and the Government has certain rights in the invention.

FIELD OF THE INVENTION

This invention relates to light emitting and lasing transistor devices used for optical communications and other purposes and, more particularly, to enhancement of the optical bandwidth of such devices.

BACKGROUND OF THE INVENTION

A part of the background of the invention relates to heterojunction bipolar transistors which operate as light-emitting transistors (LETs) and transistor lasers (TLs). Reference can be made for example, to U.S. Pat. Nos. 7,091,082, 7,286,583, 7,297,589, and 7,354,780, and to the following: U.S. patent application Ser. No. 10/646,457, filed Aug. 22, 2003; U.S. patent application Ser. No. 10/861,320, filed Jun. 4, 2004; U.S. patent application Ser. No. 11/496,161, filed Jul. 31, 2006; U.S. patent application Ser. No. 11/805,859, filed May 24, 2007; U.S. patent application Ser. No. 11/974,323, filed Oct. 12, 2007; and U.S. patent application Ser. No. 12/008, 796, filed Jan. 14, 2008; PCT International Patent Publication Number WO/2005/020287, published Mar. 3, 2005, and PCT International Patent Publication Number WO/2006/006879 published Aug. 9, 2006; all of the foregoing being assigned to the same assignee as the present Application. Reference can also be made, for example, to the following publications: Light-Emitting Transistor: Light Emission From InGaP/ GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak, M Feng, Spectrum, IEEE Volume 43, Issue 2, Feb. 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); Collector Current Map Of Gain And Stimulated Recombination On The Base Quantum Well Transitions Of A Transistor Laser, R. Chan, N. Holonyak, Jr., A. James, G. Walter, Appl. Phys. Lett. 88, 143508 (2006); High-Speed (1 GHz) Electrical And Optical Adding, Mixing, And Processing Of Square-Wave Signals With A Transistor Laser, Milton Feng; N. Holonyak, Jr.; R. Chan; A. James; G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/ InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction Of The Linewidth Enhancement, G. Walter, A. James, N. Holonyak, Jr., and M. Feng Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching Of A Transistor Laser, James, A.; Holonyak, N.; Feng, M.; Walter, G., Photonics Technology Letters, IEEE Volume: 19 Issue: 9 2007; Experimental Determination Of The Effective Minority Carrier Lifetime In The Operation Of A Quantum-Well n-p-n Heterojunction Bipolar Light-Emitting Transistor Of Varying Base Quantum-Well Design And Doping, H. W. Then, M. Feng, N. Holonyak, Jr., and C. H. Wu, Appl. Phys. Lett. 91, 033505 (2007); and Charge Control Analysis Of Transistor Laser Operation, M. Feng, N. Holonyak, Jr., H. W. Then, and G. Walter, Appl. Phys. Lett. 91, 053501 (2007).

The transistor laser has already been demonstrated to exhibit a useful relatively wide optical bandwidth. However, for applications including, but not limited to, optical communications, greater optical bandwidth is very advantageous and desirable.

It is among the objects hereof to enhance the optical bandwidth of light emitting and lasing transistor devices and circuits.

SUMMARY OF THE INVENTION

In a transistor laser (TL), the usual electrical collector ($I_C$) is complemented with a quantum well "optical collector" (hv, output port #2) inserted in the base-region of a heterojunction bipolar transistor. Besides its usual role in providing a high impedance output with current gain, $\beta(=I_C/I_B)$, the electrical collector, with its proximity to the QW ($\leqq 300$ Å), acts as a sensitive "read-out" (a "probe") of the base recombination and transport processes (see e.g. H. W. Then, M. Feng, N. Holonyak, Jr., and C. H. Wu, Appl. Phys. Lett. 91, 033505 (2007); and H. W. Then, G. Walter, M. Feng, and N. Holonyak, Jr., Appl. Phys. Lett. 91, 243508 (2007)). In accordance with an aspect hereof, the collector circuit is utilized to enhance the optical characteristics of light emitting and lasing transistor device via external control.

As will be demonstrated, applying an electrical AC auxiliary base signal to a transistor laser allows achievement of a faster stimulated recombination rate (higher peak photon operation and output), shortens the base carrier lifetime (reducing β and increasing laser differential gain), and hence, manipulates the TL into higher speed performance. This technique, applicable only in a three-terminal device configuration, is much more convenient and practical than, for example, optical methods that manipulate the laser cavity Q.

In accordance with an embodiment of a first aspect of the invention, a method is set forth for producing wide bandwidth laser emission responsive to high frequency electrical input signals, including the following steps: providing a heterojunction bipolar transistor device comprising collector, base, and emitter regions; providing at least one quantum size region in said base region, and enclosing at least a portion of said base region in an optical resonant cavity; coupling electrical signals, including said high frequency electrical input signals, with respect to said collector, base and emitter region, to cause laser emission from said transistor device; and reducing the operating beta of the transistor laser device to enhance the optical bandwidth of said laser emission in response to said high frequency electrical signals. In a preferred embodiment of this aspect of the invention, the step of reducing the operating beta of the transistor laser device comprises applying an auxiliary electrical signal to the transistor laser device. In this embodiment, the high frequency electrical input signals are in the range about 0.1-20 GHz, and said auxiliary signal has a frequency in the range 1 KHz-10 MHz. In this embodiment, the step of applying an auxiliary electrical signal to said transistor laser device comprises applying said auxiliary signal to the base region of said transistor laser device. In a form of this embodiment, the step of providing a transistor device comprises providing said transistor operating in a common emitter configuration, and wherein said input electrical signal and said auxiliary electrical signal are applied to an input electrical input port defined across the base to emitter terminals of said transistor device.

Another aspect of the invention is adapted for use in operation of a transistor laser device having an electrical input port for receiving an electrical input signal, an electrical output port, and an optical output port for outputting an optical signal modulated by said input signal, said device comprising a heterojunction bipolar transistor device that includes collector, base, and emitter regions, a quantum size region in said base region, and an optical resonant cavity enclosing at least a portion of said base region, said input port including an electrode coupled with said base region, said electrical output port including electrodes coupled with said collector and emitter regions, and said optical output port comprising an optical coupling with said base region, electrical signals, including said input electrical signal, being coupled with respect to said collector, base, and emitter regions to cause laser emission from the optical output port of said transistor laser. In this setting, a method is set forth for enhancing the response, by said laser emission at the optical output port, to high frequency electrical input signals, comprising increasing the transport of carriers to said quantum size region. In a preferred embodiment of this aspect of the invention, the step of increasing the transport of carriers to said quantum size region comprises applying an auxiliary electrical signal to said electrical input port of said transistor laser. In an embodiment hereof, the electrical input signal has a frequency in the range about 0.1-20 GHz, and said applying of an auxiliary electrical signal to said electrical input port comprises applying an auxiliary signal at a frequency in the range 1 KHz-10 MHz.

Further features and advantages of the invention will become more readily apparent from the following detailed description when taken in conjunction with the accompanying drawings.

DETAILED DESCRIPTION

Figure 1:
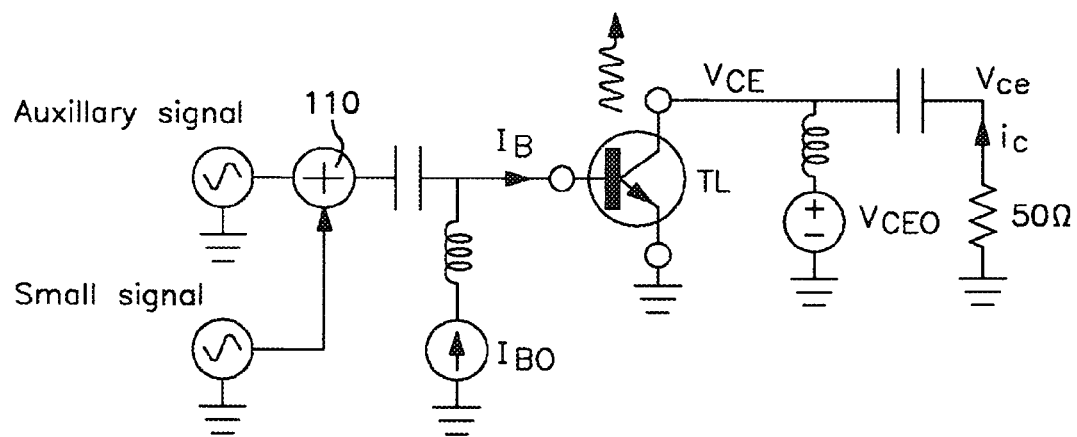
FIG. 1 is a schematic circuit diagram showing a method, in accordance with the invention for applying a relatively low-frequency auxiliary signal (e.g. 1-10 MHz) to improve the optical response (e.g. 2 to 20 GHz) of a transistor laser for an example set forth.

Devices used as a starting point for demonstrating examples of embodiments of the invention are three-port n-p-n HBT (n-InGaP/p-GaAs+InGaAs QW/n-AlGaAs) fabricated as described earlier in M. Feng, N. Holonyak, Jr., A. James, K. Cimino, G. Walter, and R. Chan, Appl. Phys. Lett. 89, 113504 (2006), supra. In particular, the TL crystal is a stack of AlGaAs, GaAs, InGaAs, and InGaP thin layers grown on a GaAs substrate by metalorganic chemical vapor deposition. Upward from the collector the p-type base region is a series of layers graded in doping, as described. The transistor contacts are realized by top-down metallization on ledges, steps, or apertures processed by photolithography and etching down to the relevant epitaxial layers of the TL crystal. The p-type 980 Å base active region for this example contains an InGaAs QW of size (width) $L_z \approx 120$ Å, giving a recombination radiation wavelength $\lambda \sim 10^3$ nm. The cleave-to-cleave emitter-base (EB) cavity length for this example is 200 μm, and the distance from emitter to the electrical collector is $W_{EC}=880$ Å, and emitter-to-QW collector $W_{EQW}=590$ Å.

Although both the electrical and optical collector perform the similar function of carrier "collection", their response times to the injection current (emitter current, $I_E$) differ because of the difference in the transport time for carriers to reach each collector and the different junction parasitics (emitter-collector device size asymmetry). In the "emitter-up" form of HBT construction, the collector cross-section (area) is usually significantly larger than the emitter cross-section. The asymmetry results in a sizeable base-collector (BC) junction capacitance, $C_{jc}$, incurring a large charging delay time. The transistor electrical delay time, $\tau_{EC}=\tau_{t,1}+C_{je}/g_m+(R_E+R_C+1/g_m)C_{jc}+\tau_C$, where $\tau_{t,1}$ and $\tau_C$ are the base and collector transit times respectively, $C_{je}$ and $C_{jc}$ are, respectively, the EB and BC junction capacitances, $g_m=dI_C/dV_{BE}$ is the transistor transconductance, and $R_E$ and $R_C$ are, respectively, the EB and BC resistances. Treating the base QW as an "optical collector" and removing the terms associated with the BC junction, one obtains for the TL optical delay time, $\tau_{EQW}=\tau_{t,2}+C_{je}/g_m$, where $\tau_{t,2}$ is the emitter-to-QW transit time over a distance $W_{EQW}$. For the TL of this example, $\tau_{EQW}$ and $\tau_{EC}$ are dominated by junction capacitance charging delays. The times $\tau_{EC}=240$ ps and $\tau_{ECW}=4$ ps are determined from measured microwave S-parameters and the transit time values $\tau_{t,1}=W_{EC}^2/2D$ and $\tau_{t,2}=W_{EQW}^2/2D$ (D being the diffusion constant in the following Table, which shows values of some key device parameters).

TABLE

| | $C_{je}$ (pF) | $C_{jc}$ (pF) | $R_E$ (Ω) | $R_C$ (Ω) | $\tau_{bulk}$ (ps) | $\tau_{t,1}$ (ps) | $\tau_{t,2}$ (ps) | D (cm$^2$/s) | $g_m$ (S) | Γ∂g/∂N without auxiliary signal (10$^{-15}$ cm$^2$) | Γ∂g/∂N with auxiliary signal (10$^{-15}$ cm$^2$) |
|---|---|---|---|---|---|---|---|---|---|---|---|
| Value | 1.5 | 15 | 5.5 | 8 | 190 | 1.5 | 0.7 | 26 | 0.47 | 3.6 | 7.2 |

Figure 2:
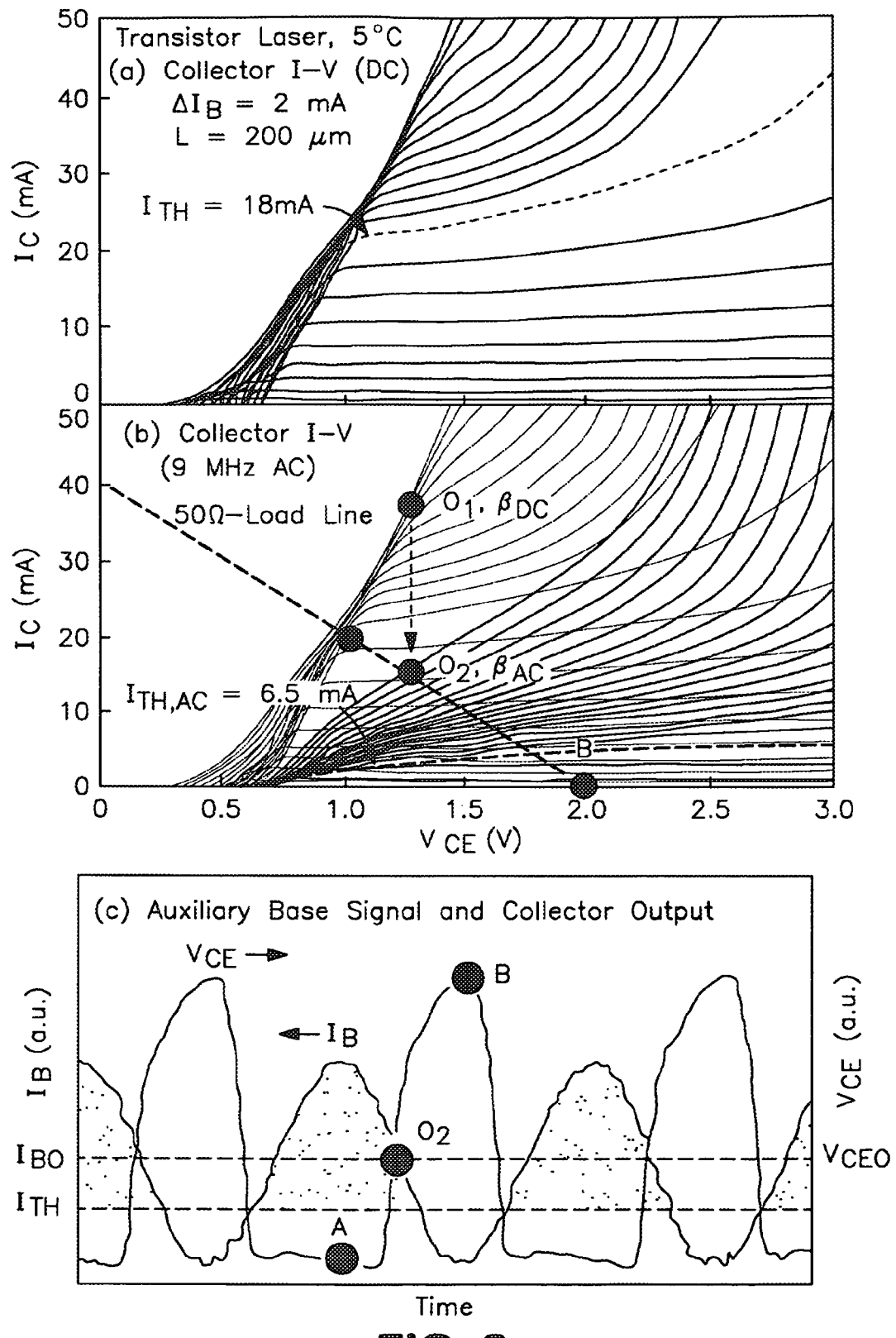
FIG. 2 shows the collector I-V characteristics of the transistor laser of the example under (a) DC bias and (b) with an AC auxiliary signal (9 MHz, 13 dBm) superimposed on the I-V characteristics of (a). The current gain is $\beta_{AC}=I_{CO,AC}/I_{BO}<\beta_{DC}=I_{CO,DC}/I_{BO}$. In (c) the time-varying collector output waveform, $V_{CE}$, and the corresponding base input, $I_B$, are shown with the shaded region indicating laser operation at $I_B>I_{TH}$. The operating points A and B correspond to transistor electrical saturation and cut-off. $O_1$ and $O_2$ are the steady-state DC operating conditions under the biases of (a) and (b).
Figure 3:
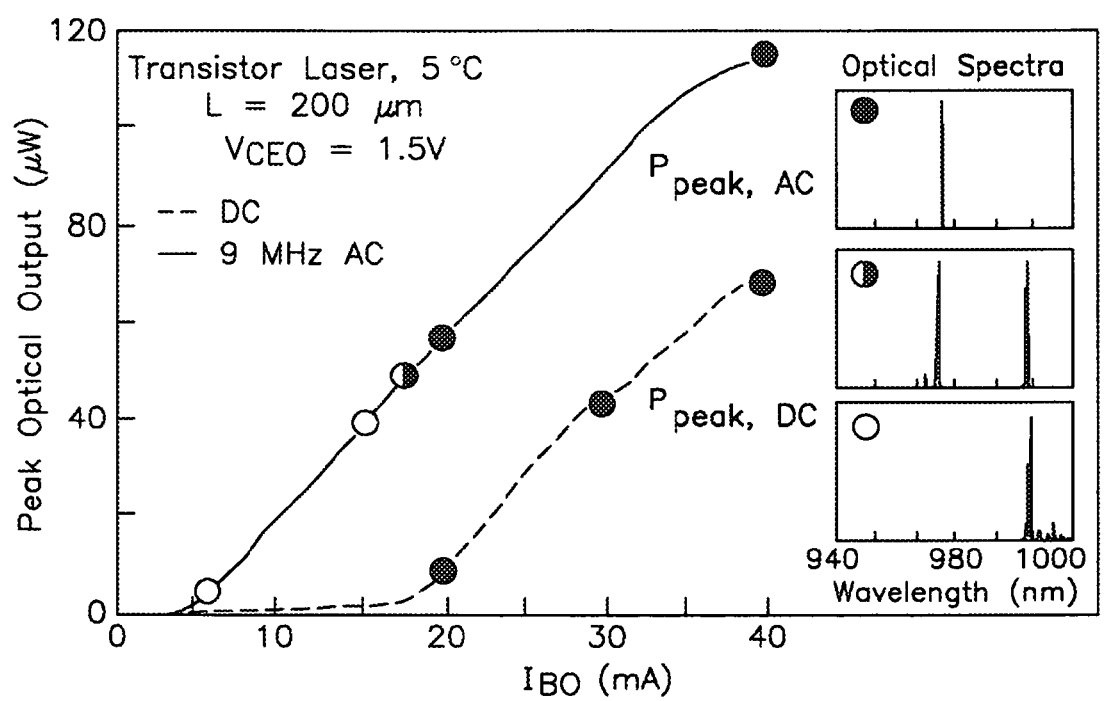
FIG. 3 shows the peak optical output power (fiber-coupled) and spectral behavior for biases (a) and (b) of FIG. 2. At laser threshold with the auxiliary signal, $I_{TH,AC}$ is 6.5 mA, and the peak base current measured with a current probe is 18.5 mA, which agrees with the threshold current, $I_{TH}$.

It is clear that the "optical" collector can "respond" faster than the electrical collector. Therefore, the overall response time of the system can be enhanced by increasing the rate of recombination (stimulated, for this laser example) at the QW. This should then be manifest as a "compression" in the collector I-V characteristics or reduction in the $\beta(=I_{CO}/I_{BO})$ (see e.g. R. Chan, M. Feng, N. Holonyak, Jr., A. James, and G. Walter, Appl. Phys. Lett. 88, 143508 (2006)). Experimentally, there are a number of ways to achieve this, one of which is to increase the Q of the cavity (see G. Walter, A. James, N. Holonyak, Jr., M. Feng, and R. Chan, Appl. Phys. Lett. 88, 232105 (2006)). In accordance with an embodiment of the invention, an electrical method is utilized. A low frequency AC auxiliary base signal is applied in order to peak the photon output and reduce the electrical β of the TL. The AC signal is applied in addition to the usual base bias current, $I_{BO}$, and collector-emitter voltage, $V_{CEO}$, as shown in FIG. 1. FIG. 1 shows the transistor laser, TL, in common emitter configuration for this example, with a 50 ohm load, and with applied DC bias voltage $V_{CEO}$ and bias current $I_{BO}$. The small signal AC input, and the auxiliary relatively low frequency AC input, are combined by adder 110 and input to the base of the TL. The resulting collector I-V characteristics and fiber-coupled peak optical output characteristics with and without the AC auxiliary signal are shown in FIGS. 2 and 3, respectively (see also, R. Chan, M. Feng, N. Holonyak, Jr., A. James, and G. Walter, Appl. Phys. Lett. 88, 143508 (2006), supra). The typical device optical output per facet is 1.2 mW at $I_{BO}$=40 mA. With the AC auxiliary base signal, $I_B$ rises and falls and the photon output of the TL peaks following the peak of $I_B$ (point A in FIG. 2b).

Here, an additional effect, unique only to transistor operation is in play. In this example, the AC output collector signals, $i_c$ and $v_{ce}$, are constrained to vary along a 50-ohm termination load-line, whose maximum and minimum amplitudes are limited by the transistor saturating at point A and cutting off at point B (FIG. 2b). $I_C$ is thus 'clipped' as is shown by the pulse-like $V_{CE}$ waveform despite an input $I_B$ that is purely sinusoidal (FIG. 2c). The average collector operating current, $I_{CO}$ is therefore reduced (from $O_1$ to $O_2$ in FIG. 2b), while the same supply of recombination current ($I_{BO}$) is maintained. Consequently, with the applied AC auxiliary base signal, β decreases from $\beta_{DC}$=1.3 to $\beta_{AC}$=0.5. The frequency of the AC auxiliary signal is thus chosen to maximize the amplitude of $I_B$ (for peak photon output) and $V_{CE}$ (for reduction of $I_{CO}$).

The reduction of β from $\beta_{DC}$ to $\beta_{AC}$ results in an increase in the proportion of injected carriers ($I_{EO}$) that are channeled to the "faster" QW collector ($I_{BO}$) and enhances the laser differential gain, which is defined as the measure of the coherent photons generated per unit length per injected carrier (see H. W. Then, M. Feng, and N. Holonyak, Jr., Appl. Phys. Lett. 91, 183505 (2007); H. W. Then, G. Walter, M. Feng, and N. Holonyak, Jr., Appl. Phys. Lett. 91, 243508 (2007)). These factors are advantageous towards improving the modulation bandwidth of the TL. From the charge control model (see M. Feng, N. Holonyak, Jr., H. W. Then, and G. Walter, Appl. Phys. Lett. 91, 053501 (2007), and neglecting the bulk recombination term, $I_{CO}=Q_1/\tau_{t,1}$ and $I_{BO}\approx Q_2/\tau_{t,2}$, where $Q_1$ and $Q_2$ are respectively the 'tilted' carrier populations responsible for the transport of carriers to the reverse-biased BC junction and to the QW. A measure of the proportion of the carriers transported to the QW, κ. is then be defined as, $$\kappa = \frac{Q_2}{Q_2 + Q_1} \approx \frac{1}{\beta\left(\frac{W_{EC}}{W_{EQW}}\right)^2 + 1}. \qquad (1)$$

As β reduces from $\beta_{DC}$=1.3 to $\beta_{AC}$=0.5, κ increases from $\kappa_{DC}$=0.26 to $\kappa_{AC}$=0.47.

Figure 4:
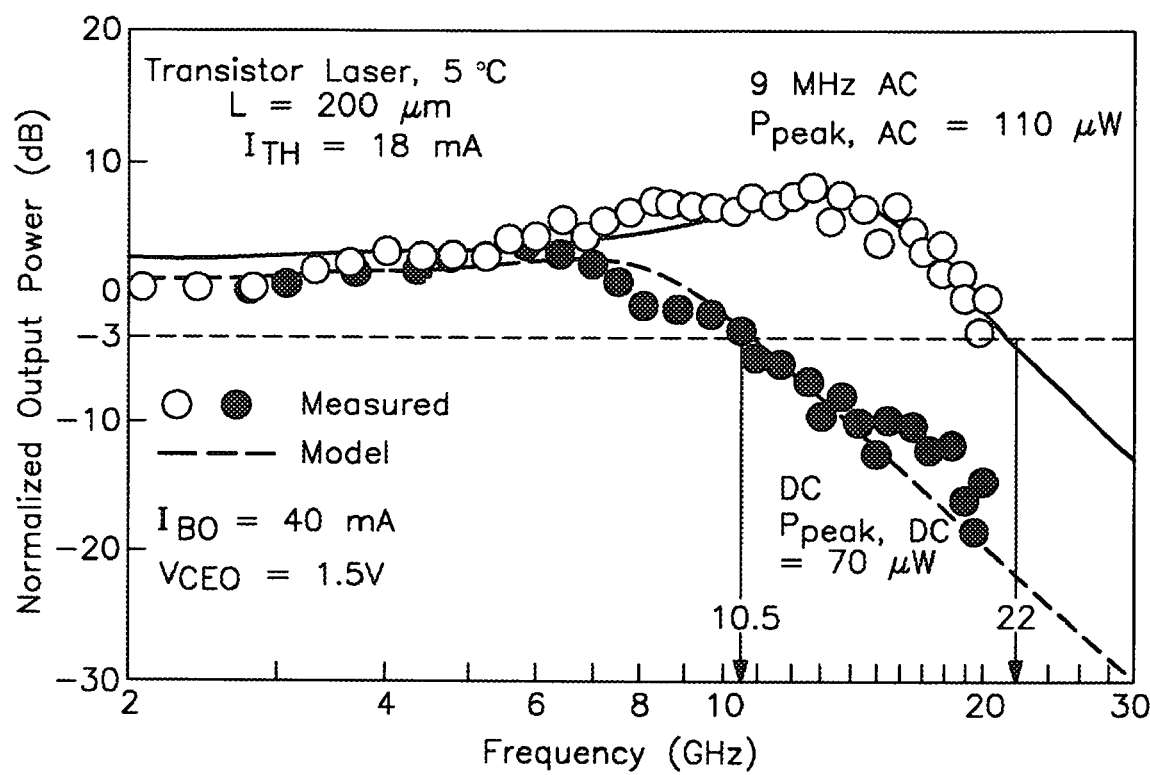
FIG. 4 shows the optical modulation response of the transistor laser of FIGS. 2 and 3 with and without an AC auxiliary signal.

To illustrate bandwidth improvement for this example, one can apply the continuity condition to the $Q_1$ and $Q_2$ populations and incorporate the effects of transit and junction charging delays, and obtain $d(Q_1+Q_2)/dt=I_E-Q_1/\tau_{EC}-Q_2/\tau_{EQW}-(Q_1+Q_2)/\tau_{bulk}$, where $\tau_{bulk}$ is the bulk recombination lifetime in the GaAs region (outside of QW). By eliminating $Q_1$ in favor of $Q_2$, we obtain $dQ_2/dt=\kappa I_E-Q_2/\tau$, and $$\tau = \frac{1}{\left(\frac{1}{\tau_{EQW}} + \frac{1}{\tau_{bulk}}\right)\kappa + \left(\frac{1}{\tau_{EC}} + \frac{1}{\tau_{bulk}}\right)(1-\kappa)}, \qquad (2)$$

where τ defines the effective base carrier lifetime, i.e., the average time an injected carrier (electron) "survives" in the base region before it recombines with a hole in the QW or is swept out by the reverse-biased field of the BC junction. An increased κ (from $\kappa_{DC}$ to $\kappa_{AC}$) means that more carriers are "channeled" to the faster QW collector ($\tau_{EQW}<\tau_{EC}$), and τ speeds up by 1.6 times from 13 ps to 7.6 ps for the transfer laser of this example. By considering the small-signal variations in $Q_2(=Q_{2O}+q_2\,e^{j\omega})$ and $I_E(=I_{EO}+i_E\,e^{j\omega})$, one obtains for the response function a 3-dB bandwidth $f_{3dB}=1/(2\pi\tau)$. The analysis is further developed to include photon-carrier interaction (see H. Statz and G. deMars, Quantum Electronics (Columbia University Press, New York, N.Y., 1960), p. 650), and gives as the laser modulation response function $$\frac{p(\omega)}{i_E(\omega)} = H(\omega)\left(\frac{1}{j\frac{\omega}{2\pi f_{3\,dB}} + 1}\right), \qquad (3)$$

where H(ω) is the intrinsic laser response described in M. Feng, N. Holonyak, Jr., H. W. Then, and G. Walter, Appl. Phys. Lett. 91, 053501 (2007), supra. The bandwidth of the intrinsic laser is determined by the square-root of the laser differential gain, ∂g/∂N and photon density, $P_o$. The intrinsic bandwidth is then reduced by the effects of junction parasitics via the pole at $f_{3dB}$ in the response function of Eq. 3. In the TL, the laser differential gain is conveniently extracted from β (see H. W. Then, G. Walter, M. Feng, and N. Holonyak, Jr., Appl. Phys. Lett. 91, 243508 (2007), supra). From the definition of laser differential gain, it is seen that the enhancement of κ, i.e., the 1.8 times improvement in the transport of injected carriers to the QW collector, will result in a similar increase in laser differential gain because of an increased proportion of injected carriers participating in the generation of photons. Using the parameters in the above Table, one can calculate the optical response of the TL giving bandwidths, $f_{3dB}$=21 GHz employing an AC auxiliary signal and 12 GHz under DC bias. This agrees well with the measured optical frequency response of the TL shown in FIG. 4.

The improvement in speed performance is not connected with issues of threshold per se. Under the application of the auxiliary AC signal, the measured peak threshold base current agrees with $I_{TH}$, the threshold current under DC or CW operation. At a DC operating bias of $I_{BO}$=40 mA ($V_{CEO}$=1.5 V), the TL of this example operates with a peak (fiber-coupled) photon intensity, $P_{peak,AC}$=110 μW, 1.6 times higher than under DC bias alone ($P_{peak,DC}$=70 μW). This is consistent with the finding that laser threshold remains unchanged.

The invention claimed is:

1. A method for producing wide bandwidth laser emission responsive to high frequency electrical input signals, comprising the steps of:
   providing a heterojunction bipolar transistor device comprising collector, base, and emitter regions;
   providing at least one quantum size region in said base region, and enclosing at least a portion of said base region in an optical resonant cavity;
   coupling electrical signals, including said high frequency electrical input signals in the range about 0.1-20 GHz, with respect to said collector, base and emitter region, to cause laser emission from said transistor device; and
   reducing the operating beta of the transistor laser device, by applying an auxiliary electrical signal having a frequency in the range 1 KHz-10 MHz, to said transistor laser device, to enhance the optical bandwidth of said laser emission in response to said high frequency electrical signals.

2. The method as defined by claim 1, wherein said step of applying an auxiliary electrical signal to said transistor laser device comprises applying said auxiliary electrical signal to the base region of said transistor laser device.

3. The method as defined by claim 2, wherein said step of providing a transistor device comprises providing said transistor operating in a common emitter configuration, and wherein said input electrical signal and said auxiliary electrical signal are applied to an input electrical input port defined across the base to emitter terminals of said transistor device.

4. The method as defined by claim 1, wherein said step of providing a quantum size region in the base region of said transistor device comprises providing a quantum well in said base region.

5. The method as defined by claim 1, wherein said step of providing a quantum size region in the base region of said transistor device comprises providing at least one quantum well in said base region.

6. The method as defined by claim 2, further comprising modifying the frequency of said auxiliary electrical signal to maximize the base current of said transistor device.

7. The method as defined by claim 3, further comprising modifying the frequency of said auxiliary electrical signal to maximize the base current of said transistor device.

8. The method as defined by claim 1, wherein said step of reducing the operating beta of said transistor laser device to enhance the optical bandwidth of said laser emission in response to high frequency electrical signals includes increasing the transport of carriers to said quantum size region.

9. The method as defined by claim 4, wherein said step of reducing the operating beta of said transistor laser device to enhance the optical bandwidth of said laser emission in response to high frequency electrical signals includes increasing the transport of carriers to said quantum well.

10. For use in operation of a transistor laser device having an electrical input port for receiving an electrical input signal, an electrical output port, and an optical output port for outputting an optical signal modulated by said input signal, said device comprising a heterojunction bipolar transistor device that includes collector, base, and emitter regions, a quantum size region in said base region, and an optical resonant cavity enclosing at least a portion of said base region, said input port including an electrode coupled with said base region, said electrical output port including electrodes coupled with said collector and emitter regions, and said optical output port comprising an optical coupling with said base region, electrical signals, including said input electrical signal, being coupled with respect to said collector, base, and emitter regions to cause laser emission from the optical output port of said transistor laser; a method for enhancing the response, by said laser emission at the optical output port, to high frequency electrical input signals in the ramie about 0.1-20 GHz, comprising increasing the transport of carriers to said quantum size region by applying an auxiliary electrical signal haying a frequency in the range 1 KHz-10 MHz to said electrical input port of said transistor laser.

11. The method as defined by claim 10, wherein said electrical output port has a load impedance coupled therewith.

12. A method for increasing the optical bandwidth of laser emission responsive to high frequency electrical input signals, comprising the steps of:
   providing a heterojunction bipolar transistor device comprising collector, base, and emitter regions;
   providing at least one quantum size region in said base region, and enclosing at least a portion of said base region in an optical resonant cavity;
   coupling electrical signals, including said high frequency electrical input signals in the range about 0.1-20 GHz, with respect to said collector, base and emitter region, to cause laser emission from said transistor device; and
   providing an auxiliary electrical signal having a frequency in the range 1 KHz-10 MHz to said transistor to increase the transport of electrical carriers to said quantum size region.

13. The method as defined by claim 12, wherein said step of providing an auxiliary signal to said transistor comprises applying said signal to the base region to said transistor.

14. The method as defined by claim 13, where said step of providing at least one quantum size region in the base region of said transistor device comprises providing at least one quantum well in said base region.

* * * * *